(12) United States Patent
Elmer et al.

(10) Patent No.: US 7,348,568 B2
(45) Date of Patent: Mar. 25, 2008

(54) ELECTRON BEAM DIAGNOSTIC FOR PROFILING HIGH POWER BEAMS

(75) Inventors: John W. Elmer, Danville, CA (US); Todd A. Palmer, Livermore, CA (US); Alan T. Teruya, Livermore, CA (US)

(73) Assignee: Lawrence Livermore Natonal Security, LLC, Livermore, CA (US)

( * ) Notice: Subject to any disclaimer, the term of this patent is extended or adjusted under 35 U.S.C. 154(b) by 77 days.

(21) Appl. No.: 11/159,978

(22) Filed: Jun. 22, 2005

(65) Prior Publication Data
US 2005/0285047 A1 Dec. 29, 2005

Related U.S. Application Data

(60) Provisional application No. 60/583,156, filed on Jun. 24, 2004.

(51) Int. Cl.
*G01K 1/16* (2006.01)
(52) U.S. Cl. .................................................. 250/397
(58) Field of Classification Search ................ 250/397
See application file for complete search history.

(56) References Cited

U.S. PATENT DOCUMENTS

| | | | | |
|---|---|---|---|---|
| 4,304,979 A | * | 12/1981 | Dietrich et al. | 219/121.13 |
| 4,703,256 A | * | 10/1987 | Hayafuji | 324/71.3 |
| 4,829,243 A | * | 5/1989 | Woodard et al. | 324/751 |
| 5,382,895 A | | 1/1995 | Elmer et al. | |
| 5,401,973 A | * | 3/1995 | McKeown et al. | 250/492.3 |
| 5,468,966 A | | 11/1995 | Elmer et al. | |
| 5,554,926 A | | 9/1996 | Elmer et al. | |
| 5,583,427 A | | 12/1996 | Teruya et al. | |
| 5,610,968 A | * | 3/1997 | Deucher et al. | 378/199 |
| 6,297,510 B1 | * | 10/2001 | Farley | 250/492.21 |
| 6,300,755 B1 | | 10/2001 | Elmer et al. | |
| 2003/0222227 A1 | * | 12/2003 | Richards et al. | 250/492.21 |

OTHER PUBLICATIONS

Elmer, J.W., et al., "An Enhanced Faraday Cup for Rapid Determination of Power Density Distribution in Electron Beams," Welding Research Supplement, Dec. 2001, pp. 288-295.

* cited by examiner

*Primary Examiner*—Dave Porta
*Assistant Examiner*—Marcus H Taningco
(74) *Attorney, Agent, or Firm*—Eddie E. Scott; John H. Lee

(57) ABSTRACT

A system for characterizing high power electron beams at power levels of 10 kW and above is described. This system is comprised of a slit disk assembly having a multitude of radial slits, a conducting disk with the same number of radial slits located below the slit disk assembly, a Faraday cup assembly located below the conducting disk, and a start-stop target located proximate the slit disk assembly. In order to keep the system from over-heating during use, a heat sink is placed in close proximity to the components discussed above, and an active cooling system, using water, for example, can be integrated into the heat sink. During use, the high power beam is initially directed onto a start-stop target and after reaching its full power is translated around the slit disk assembly, wherein the beam enters the radial slits and the conducting disk radial slits and is detected at the Faraday cup assembly. A trigger probe assembly can also be integrated into the system in order to aid in the determination of the proper orientation of the beam during reconstruction. After passing over each of the slits, the beam is then rapidly translated back to the start-stop target to minimize the amount of time that the high power beam comes in contact with the slit disk assembly. The data obtained by the system is then transferred into a computer system, where a computer tomography algorithm is used to reconstruct the power density distribution of the beam.

20 Claims, 3 Drawing Sheets

ELECTRON BEAM DIAGNOSTIC FOR PROFILING HIGH POWER BEAMS

CROSS-REFERENCE TO RELATED APPLICATIONS

This application claims the benefit of U.S. Provisional Patent Application No. 60/583,156 filed Jun. 24, 2004 by John W. Elmer, Todd A. Palmer, and Alan T. Teruya titled "Electron Beam Diagnostic for Profiling High Power Beams." U.S. Provisional Patent Application No. 60/583,156 filed Jun. 24, 2004 and titled "Electron Beam Diagnostic for Profiling High Power Beams" is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to electron beams and more particularly to a system for profiling high power beams.

2. State of Technology

U.S. Pat. No. 6,300,755 for enhanced modified faraday cup for determination of power density distribution of electron beams issued to John W. Elmer and Alan T. Teruya Oct. 9, 2001 provides the following state of technology information, "Electron beams are considered to be the most precise and clean method available for welding thick sections of materials. Unfortunately, electron beams suffer one critical deficiency, namely the repeatability of focusing the beam to a known power density. Without the ability to reliably reproduce the power distribution in an electron beam, weld quality cannot be guaranteed. This problem is exacerbated by the fact that many welds are made over a period of time and with different welding operators. Further complications arise when welds are developed on one machine than transferred to a different machine for production."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system for characterizing high power electron beams at the 10 kW level and higher. This system is based on three basic considerations, (1) larger beams are produced at higher beam powers, (2) higher heat carrying capacity is needed in the diagnostic system, and (3) the potential for damage to the tungsten slit disk assembly of the system must be minimized.

The system for characterization of a high power beam of the present invention comprises a slit disk assembly of an electrically conductive refractory material. The slit disk assembly has at least one radial slit extending through the slit disk assembly and a slit disk assembly central hole extending through the slit disk assembly. The radial slit and the slit disk assembly central hole are positioned to receive the high power beam and allow the high power beam to pass through the radial slit and the slit disk assembly central hole. A conducting disk is located below the slit disk assembly. The conducting disk has at least one conducting disk radial slit extending through the conducting disk and a conducting disk central hole extending through the conducting disk. The conducting disk radial slit is positioned below and aligned with the radial slit in the slit disk assembly and the conducting disk central hole positioned below and aligned with the slit disk assembly central hole. The conducting disk radial slit and the conducting disk central hole are positioned to receive the high power beam and allow the high power beam to pass through the conducting disk radial slit and the conducting disk central hole. A Faraday cup assembly is located below the conducting disk and positioned to receive the high power beam that passes through the conducting disk central hole. A start-stop target is located proximate to the slit disk assembly.

The system for characterization of a high power beam is operated by directing the beam onto the start-stop target; directing the beam onto the slit disk assembly; translating the beam to the radial slits wherein the beam enters the radial slits and the conducting disk radial slits where it is detected at the Faraday cup assembly; and translating the beam back onto the start-stop target.

In one embodiment, a heat sink is positioned in proximity to the slit disk assembly, the conducting disk, and the Faraday cup assembly. In another embodiment, a system is provided for circulating a fluid, such as water through the heat sink. In one embodiment, the slit disk assembly includes a trigger probe.

The system for characterization of a high power beam has many uses. For example, the system for characterization of a high power beam has use for the welding of larger components, for melting and refining of metals and alloys, and for vaporizing metals for vapor deposition purposes. The high power applications may use 10 s of kWs of power.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
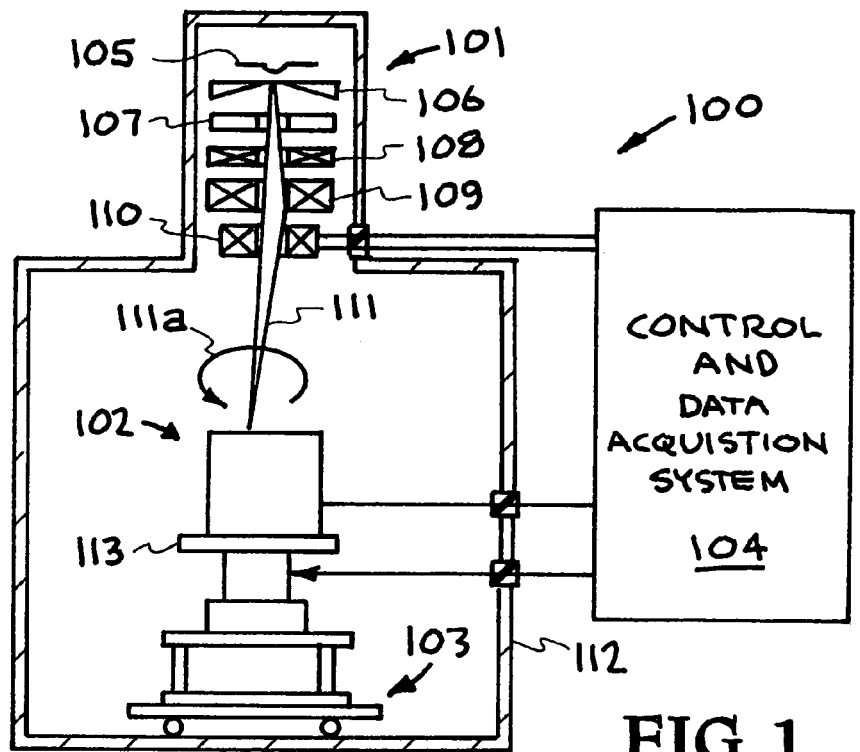
FIG. 1 illustrates an embodiment of a system constructed in accordance with the present invention.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Referring now to the drawings and in particular to FIG. 1, an embodiment of a system constructed in accordance with the present invention is illustrated. The system is designated generally by the reference numeral 100. The system 100 is an electron beam diagnostic system for profiling high power beams. The existing diagnostic system is designed to work in the 1 kW power range. The system for profiling high power beams 100 described herein can operate at power ranges in the 10 kW range and above. The diagnostic system 100 for high power beams involves three basic considerations, (1) larger beams are produced at higher beam powers, (2) higher heat carrying capacity is needed in the diagnostic system, and (3) the potential for damage to the tungsten slit disk assembly of the system must be minimized.

The system 100 has many uses, for example the system 100 can be used to provide high power electron beam welds of high value added components (aerospace, nuclear industries), electron beam melting for alloy refinement, and vapor deposition. When using the system 100, the electron beam focus can be precisely controlled and repeated for quality control purposes, welds can be repeated on the same machine over a period of time, and electron beam parameters can be transferred between different machines.

The system 100 includes structural components that provide a diagnostic system for high power beams. The diagnostic system 100 involves interconnected components or systems including an electron beam gun system generally indicated by the reference numeral 101, a modified Faraday cup (MFC) system generally indicated by the reference numeral 102, a positioning system generally indicated by the reference numeral 103, and a control and data acquisition system generally indicated by the reference numeral 104. The components are contained in a vacuum chamber 112.

The electron beam is indicated at 111. The beam 111 is moved via deflection coils 110 and this movement is generally indicated at 111A. In operation the beam 111 is swept across the slits in the modified Faraday cup system 102. The beam 111 is swept around the modified Faraday cup system 102 in a circular pattern to enter slits in the modified Faraday cup system 102.

The electron beam gun system 101 can be used for welding and processing. The electron beam gun system 101 basically comprises a filament 105, cathode 106, anode 107, alignment coil 108, a magnetic lens 109, and deflection coils 110. The filament 105 may be of any desired cathode configuration, such as a ribbon type.

The modified Faraday cup assembly 102 is mounted on the rotatable/movable MFC assembly 103. The positioning stage 103 utilizes a rotatable/movable member or stage system to position the modified Faraday cup (MFC) system 102. The positioning stage 103 includes X, Y and Z translation stages, providing capability of movement in the X, Y, and Z directions as indicated by the double arrows. The positioning stage 103 also includes a rotational stage to provide the capability of rotational movement of the Faraday cup (MFC) system 102, as indicated by the arrow $\theta$.

Mounting the modified Faraday cup system 102 onto the positioning stage 103 allows for controlled, repeated positioning of the modified Faraday cup (MFC) system 102. In operation, beam waveforms are taken by sweeping the beam 111 around the modified Faraday cup assembly 102. Additional details and structural elements of the positioning stage 103 are not shown because they are known in the art.

The control and data acquisition system 104 functions to control the modified Faraday cup (MFC) system 102 as well as processing and storing the acquired data. Various details and operations of the control and data acquisition system 104 will be described subsequently in connection the operation of the diagnostic system 100. Basic details and structural elements of the control and data acquisition system 104 are not shown or discussed here because they are systems known in the art.

Certain of the elements of the diagnostic system 100 and the procedures for operating the diagnostic system 100 are the same as or similar to the systems shown and described in U.S. Pat. No. 5,382,895, U.S. Pat. No. 5,468,966, U.S. Pat. No. 5,554,926, U.S. Pat. No. 5,583,427, and U.S. Pat. No. 6,300,755. The disclosures of U.S. Pat. No. 5,382,895, U.S. Pat. No. 5,468,966, U.S. Pat. No. 5,554,926 U.S. Pat. No. 5,583,427, and U.S. Pat. No. 6,300,755 are incorporated herein by this reference.

Figure 2:
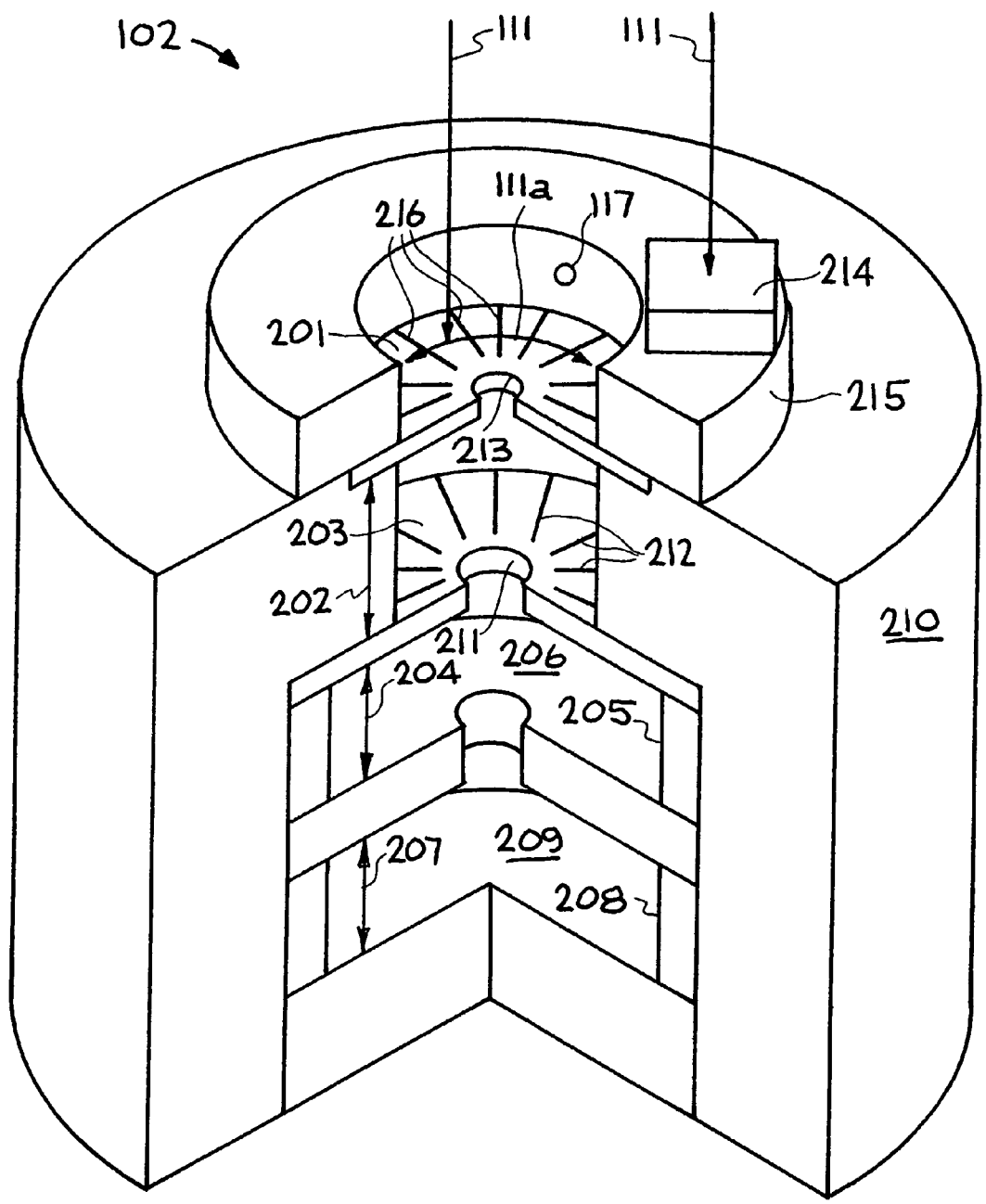
FIG. 2 shows additional details of the diagnostic system for high powered beams illustrated in FIG. 1.

Referring now to FIG. 2, an illustration shows additional details of the diagnostic system for high powered beams 100 that was previously described and illustrated in FIG. 1. As illustrated in FIG. 2, the system 100 includes the interconnected components or systems that were described in connection with FIG. 1 including the modified Faraday cup (MFC) system 102 and the high power beam 111. The MFC system 102 includes the basic components of: a slit disk assembly 201, a conducting disk 203 located below the slit disk assembly 201, a Faraday cup assembly 206 located below the conducting disk 203, and a start-stop target 214 located proximate the slit disk assembly 201. A multiplicity of circumferential radial slits 216 and a trigger probe 217 are located in the slit disk assembly 201. A corresponding multiplicity of circumferential radial slits 212 are located in the conducting disk 203. In order to keep the system 102 from over-heating during use, a heat sink is placed in close proximity to the components. An active cooling system, using water or other cooling fluid, is integrated into the heat sink as subsequently illustrated.

The system 100 provides diagnostics for measuring the power density distribution of the high power and high intensity beam 111. During operation, the beam 111 is rotated about the central point of the slit disk assembly 201 over the aligned radial slits 216 and 212. Electrons or ions pass through the aligned radial slits 216 and 212 and are intercepted by the Faraday cup assembly 206 where they are detected and a signal is sent to the measuring and data acquisition system 104 to measure the profile of the beam. Computed tomography can then be used to reconstruct the power density distribution of the beam 111.

In order to prevent damage to the tungsten slit disk assembly 201, the time over which the beam 111 comes in contact with the tungsten slit disk assembly 201 is reduced. In order to do this, the target block 214 is located to the side of the tungsten slit disk assembly 201. The target block 214 is made of a refractory metal. The beam 111 is first directed onto the target block 214 as illustrated in FIG. 2, and then the beam is translated to the radial slits 216, where it is translated in a circle indicated at 111A for a minimum number of rotations and then translated back onto the target block 214. The trigger probe 217 initiates the system 100. This is accomplished by trigger probe 217 sensing scattered electrons produced as the beam 111 passes through a region between slits 216 and directly in front of trigger probe 217. Details of the trigger probe 217 and its operation are described in co-pending U.S. application Ser. No. 60/582,574 filed Jun. 24, 2005 by John W. Elmer, Todd A. Palmer, and Alan T. Teruya titled, "A Trigger Probe for Determining the Orientation or the Power Distribution of an Electron Beam." U.S. application Ser. No. 60/582,754 filed Jun. 24, 2004 by John W. Elmer, Todd A. Palmer, and Alan T. Teruya titled, "A Trigger Probe for Determining the Orientation or the Power Distribution of an Electron Beam" is incorporated herein by this reference.

The diagnostic system 100 provides a system for rapidly measuring the power density distribution of an electron or an ion beam. The system captures beam profiles in a fraction of a second as the beam is moved in a circular pattern over the MFC system 102. The individual beam profiles are then reconstructed using a computed tomographic method to render an image of the beam shape, size, and power density distribution. The data is gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines.

Referring again to FIG. 2, the diagnostic system for high powered beams 100 will be described in greater detail. The modified Faraday cup (MFC) system 102 includes the following structural components: slit disk assembly 201, space 202 between the slit disk assembly and conducting disk, conducting disk 203, space 204 between the conducting disk and the Faraday cup assembly, spacer ring 205, Faraday cup assembly 206, space 207 between the Faraday cup assembly and the bottom plate, spacer ring 207, bottom plate 209, heat sink 210, hole 211 in the conducting disk, circumferential radial slits 212 in the conducting disk, hole 213 in the slit disk assembly, start-stop target 214, mounting ring 215, circumferential radial slits 216 in the slit disk assembly, and trigger probe 217.

The slit disk assembly 201 of the MFC system 102 is made of an electrically conductive refractory material. Refractory materials are required to minimize damage to the slit disk assembly 201 by the high power beam 111. This material should also have a high average atomic number to intercept the beam 111, and be sufficiently thick to prevent the beam 111 from penetrating through to the underlying layers. In the embodiment shown in FIG. 2, the slit disk assembly 201 is made of tungsten.

The system 100 provides diagnostics for measuring the power density distribution of the high power and high intensity beam 111. During operation, the beam 111 is rotated about the central point of the slit disk assembly 201 over the aligned radial slits 216 and 212. Electrons or ions pass through the aligned radial slits 216 and 212 and are intercepted by the Faraday cup assembly 206 where they are detected and a signal is sent to the measuring and data acquisition system 104 to measure the profile of the beam. Computed tomography can then be used to reconstruct the power density distribution of the beam 111.

The diagnostic system 100 provides a system for rapidly measuring the power density distribution of an electron or an ion beam. The system captures beam profiles in a fraction of a second as the beam is moved in a circular pattern over the MFC system 102. The individual beam profiles are then reconstructed using a computed tomographic method to render an image of the beam shape, size, and power density distribution. The data is gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines.

In order to prevent damage to the tungsten slit disk assembly 201, the time over which the beam 111 comes in contact with the tungsten slit disk assembly 201 is reduced. In order to do this, the target block 214 is located to the side of the tungsten slit disk assembly 201. The target block 214 is made of a refractory metal. The beam 111 is first directed onto the target block 214 and then translated to the radial slits 216, where it is translated in a circle for a minimum number of rotations and then translated back onto the target block 214. The trigger probe 217 acts as a trigger to initiate the control and data acquisition system 104 and control the number of rotations of the beam 111 and the translation of the beam 111 back onto the target block 214.

The slit disk assembly 201 is a seventeen (17) slit tungsten disk. The beam 111 is rotated over this disk 201 in a circle. It is important that the beam does not go through two slits at the same time, so the largest diameter beam that is measured corresponds to the spacing between the slits 216. Keeping the same radial pattern with 17 slits, the size of the beam 111 that can be measured scales directly with the beam rotation diameter. Therefore, for the tungsten disk 201 to be large enough to accommodate a 2 inch diameter beam path, it would allow beams with twice the diameter of the existing design to be inspected, i.e., 0.36 inch diameter beams, etc. The large diameter tungsten disk 201 is capable of measuring beams up to 0.75 inch in diameter. Note that most electron beams, even high power beams, are less than 1 mm in diameter when they are sharply focused. However, defocused beams are often used, particularly for melting and vapor deposition applications, where the beam diameters may be much larger.

Figure 3:
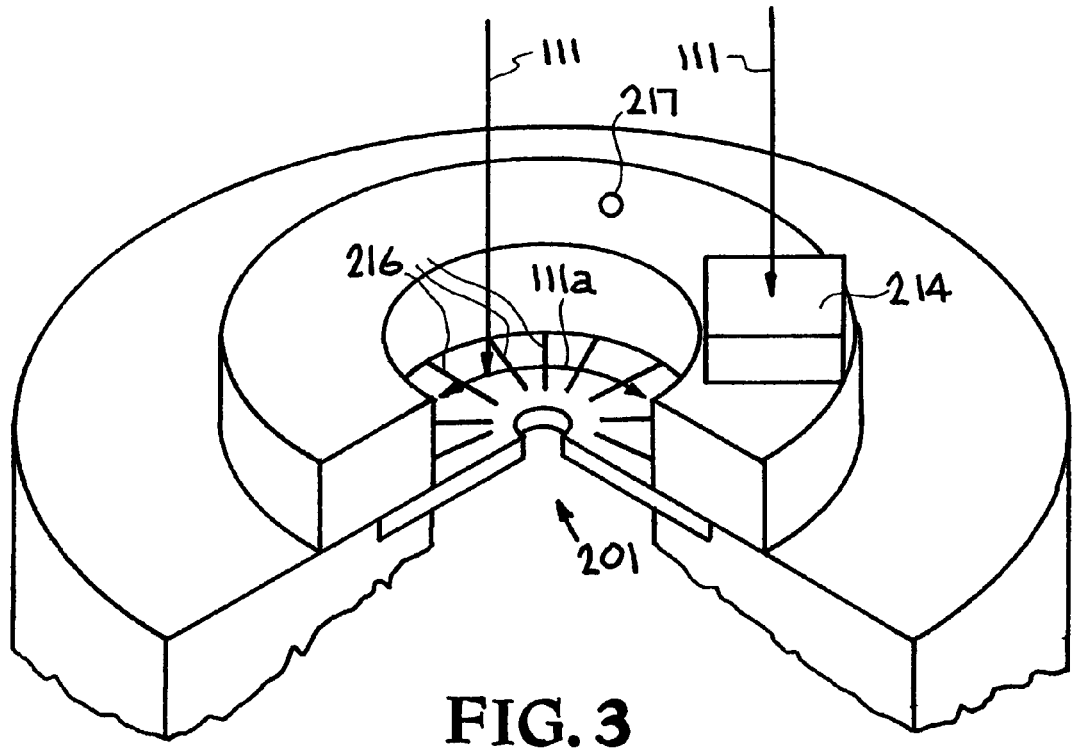
FIG. 3 shows additional details of the diagnostic system for high powered beams illustrated in FIG. 2.

Referring now to FIG. 3, the modified Faraday cup (MFC) system 102 will be described in greater detail. The MFC system 102 includes the slit disk assembly 201 with circumferential radial slits 216 and trigger probe 217. In order to prevent damage to the tungsten slit disk assembly 201, the time over which the beam 111 comes in contact with the tungsten slit disk assembly 201 is reduced. The beam 111 is first directed onto the target block 214. Next the beam 111 is translated to the slit disk assembly 201. In order to prevent damage to the slit disk assembly 201, the beam 111 needs to be rotated in a circle over the slit disk assembly 102 for a minimum number of rotations. The beam enters the trigger probe 217 which initiates the control and data acquisition system 104 and controls the number of rotations of the beam 111 over the slit disk assembly 102. After predetermined number of rotations, the beam 111 is translated back onto the target block 214. This is accomplished by trigger probe 217 sensing scattered electrons produced as the beam 111 passes through a region between slits 216 and directly in front of trigger probe 217.

As the beam 111 rotates it enters the circumferential radial slits 216 and the diagnostic system produces individual beam profiles using a computed tomographic method to render an image of the beam shape, size, and power density distribution. The data is gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines.

Figure 4:
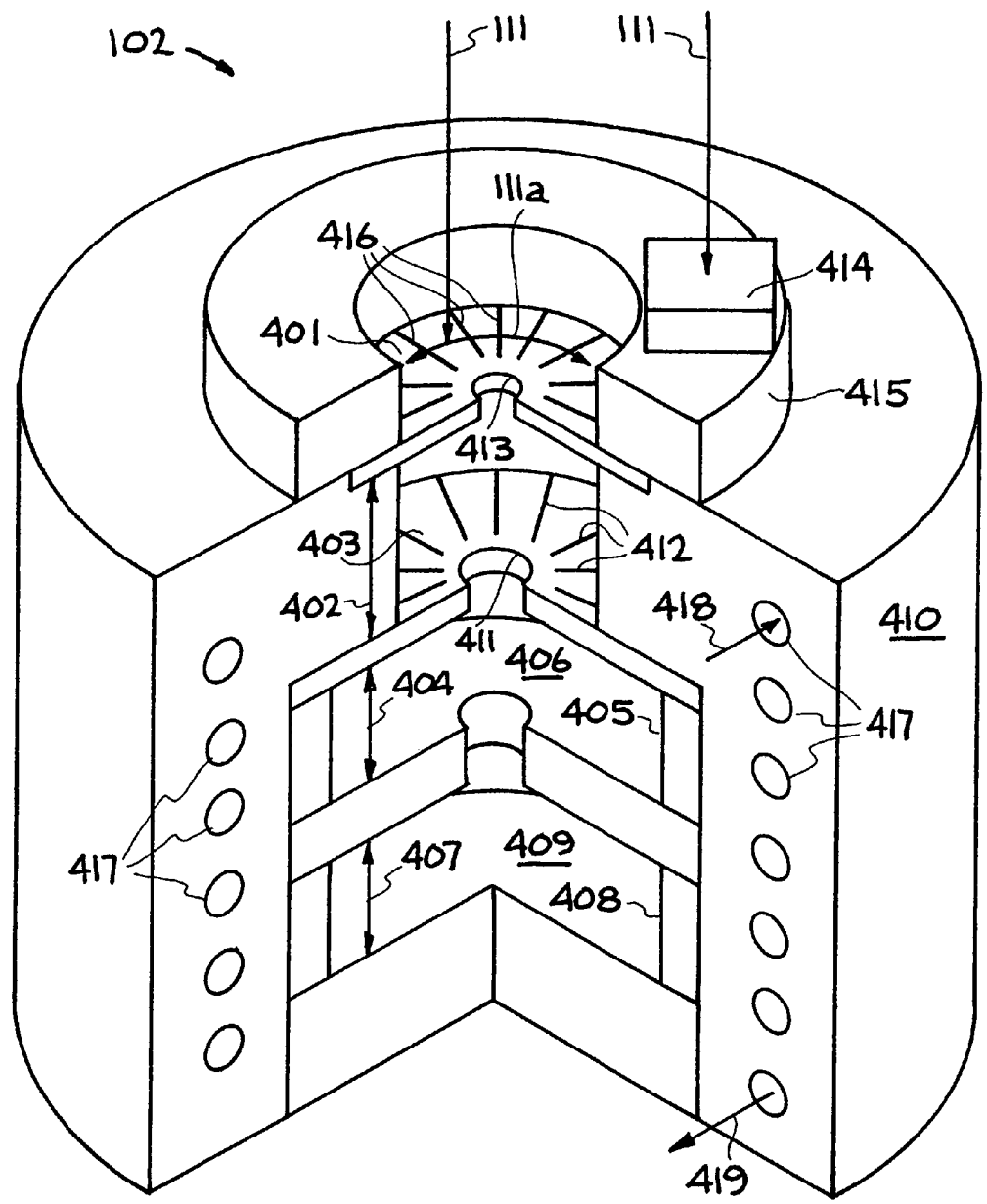
FIG. 4 shows details of another embodiment of the diagnostic system for high powered beams illustrated in FIG. 1.

Referring now to FIG. 4, another embodiment of a diagnostic system for high powered beams is illustrated. The diagnostic system for high powered beams includes the interconnected components or systems that were described in connection with FIG. 1, including the modified Faraday cup (MFC) system 102 and the high power beam 111. The modified Faraday cup (MFC) system 102 includes the following structural components: slit disk assembly 401, space 402 between the slit disk assembly and conducting disk, conducting disk 403, space 404 between the conducting disk and the Faraday cup assembly, spacer ring 405, Faraday cup assembly 406, space 407 between the Faraday cup assembly and the bottom plate, spacer ring 407, bottom plate 409, heat sink 410, hole 411 in the conducting disk, circumferential radial slits 412 in the conducting disk, hole 413 in the slit disk assembly, start-stop target 414, mounting ring 415, circumferential radial slits 416 in the slit disk assembly, holes in the heat sink 410, fluid in 418, and fluid out 419.

The diagnostic system for high powered beams provides diagnostics for measuring the power density distribution of the high power and high intensity beam 111. During operation, the beam 111 is rotated about the central point of the slit disk assembly 401 over the aligned radial slits 416 and 412. One of the slits 416 acts to initiate the system 100. Electrons or ions pass through the aligned radial slits 416 and 412 and are intercepted by the Faraday cup assembly 406 where they are detected and a signal is sent to the measuring and data acquisition system 104 to measure the profile of the beam. Computed tomography can then be used to reconstruct the power density distribution of the beam 111.

The diagnostic system 100 provides a system for rapidly measuring the power density distribution of an electron or an ion beam. The system captures beam profiles in a fraction of a second as the beam is moved in a circular pattern over the MFC system 102. The individual beam profiles are then reconstructed using a computed tomographic method to render an image of the beam shape, size, and power density distribution. The data is gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines.

In order to prevent damage to the tungsten slit disk assembly 401, the time over which the beam 111 comes in contact with the tungsten slit disk assembly 401 is reduced. In order to do this, the target block 414 is located to the side of the tungsten slit disk assembly 401. The target block 414 is made of a refractory metal. The beam 111 is first directed onto the target block 414 and then translated to the radial slits 416, where it is translated in a circle for a minimum number of rotations and then translated back onto the target block 414. The copper heat sink 410 is located adjacent the slit disk assembly 401, the conducting disk 403 located below the slit disk assembly 401, the Faraday cup assembly 406 located below the conducting disk 403, and the start-stop target 414. The copper heat sink 410 includes cooling tubes 417 that allow fluid to be circulated in a spiral pattern around system for cooling. The fluid is introduced to the cooling tubes 417 as illustrated by the arrow 418 and the fluid exits as illustrated by the arrow 419. In the embodiment shown in FIG. 4 the fluid is water.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. An apparatus for characterization of a high power electron welding beam having a power range of more than 1 kW, comprising:
   a high power electron welding beam having a power range of more than 1 kW;
   a slit disk assembly comprising an electrical conducting refractory material having at least one radial slit extending through said slit disk assembly and a slit disk assembly central hole extending through said slit disk assembly, said radial slit and slit disk assembly central hole being positioned to receive the high power electron welding beam having a power range of more than 1 kW and allow the high power electron welding beam having a power range of more than 1 kW to pass through said at least one radial slit and said slit disk assembly central hole;
   a conducting disk located below said slit disk assembly, said conducting disk having at least one conducting disk radial slit extending through said conducting disk and a conducting disk central hole extending through said conducting disk, said at least one conducting disk radial slit positioned below and aligned with said at least one radial slit in said slit disk assembly and said conducting disk central hole positioned below and aligned with said slit disk assembly central hole, said at least one conducting disk radial slit and said conducting disk central hole being positioned to receive the high power electron welding beam having a power range of more than 1 kW and allow the high power electron welding beam to pass through said at least one conducting disk radial slit and said conducting disk central hole;
   a Faraday cup assembly located below said conducting disk and positioned to receive the high power electron welding beam having a power range of more than 1 kW that passes through said conducting disk central hole; and
   a start-stop target located adjacent said slit disk assembly, wherein said start-stop target is located a fixed distance radially outward from said at least one radial slit, and wherein said start-stop target is located a fixed distance radially outward from said slit disk assembly central hole, and wherein said start-stop target is positioned to receive the high power electron welding beam having a power range of more than 1 kW, and wherein said welding beam having a power range of more than 1 kW is adapted to be translated to said at least one radial slit.

2. The apparatus for characterization of a high power electron welding beam of claim 1 wherein said start-stop target comprises an electrical conducting refractory material.

3. The apparatus for characterization of a high power electron welding beam of claim 1 wherein said start-stop target comprises tungsten.

4. The apparatus for characterization of a high power electron welding beam of claim 1 including a cooper heat sink positioned proximate said slit disk assembly, said conducting disk, and said Faraday cup assembly.

5. The apparatus for characterization of a high power electron welding beam of claim 1 including a heat sink positioned proximate said slit disk assembly, said conducting disk, and said Faraday cup assembly.

6. The apparatus for characterization of a high power electron welding beam of claim 5 including a system for circulating a fluid through said heat sink.

7. The apparatus for characterization of a high power electron welding beam of claim 5 including a system for circulating water through said heat sink.

8. The apparatus for characterization of a high power electron welding beam of claim 1 wherein said slit disk assembly includes a trigger probe.

9. A method of characterizing a high power electron welding beam having a power range of more than 1 kW, comprising the steps of:

providing a slit disk assembly having radial slits, a conducting disk having conducting disk radial slits located below said slit disk assembly, and a Faraday cup assembly located below said conducting disk, positioning a start-stop target proximate said slit disk assembly, positioning and maintaining said start-stop target a fixed distance radially outward from said radial slits, positioning and maintaining said start-stop target a fixed distance radially outward from said conducting disk radial slits, positioning said start-stop target to receive the high power electron welding beam having a power range of more than 1 kW, operating the high power electron welding beam at a power range of more than 1 kW;

directing the high power electron welding beam having a power range of more than 1 kW onto said start-stop target;

directing the high power electron welding beam having a power range of more than 1 kW onto said slit disk assembly;

translating the high power electron welding beam having a power range of more than 1 kW to said radial slits wherein the high power electron welding beam having a power range of more than 1 kW enters said radial slits and said conducting disk radial slits where it is detected at said Faraday cup assembly; and translating the high power electron welding beam having a power range of more than 1 kW back onto said start-stop target.

10. The method of characterizing a high power electron welding beam of claim 9 including positioning a heat sink proximate said slit disk assembly.

11. The method of characterizing a high power electron welding beam of claim 9 including positioning a heat sink proximate said slit disk assembly and circulating a fluid through said heat sink.

12. The method of characterizing a high power electron welding beam of claim 9 including positioning a heat sink proximate said slit disk assembly and circulating water through said heat sink.

13. The method of characterizing a high power electron welding beam of claim 9 including positioning a heat sink proximate said slit disk assembly, said conducting disk, and said Faraday cup assembly.

14. The method of characterizing a high power electron welding beam of claim 9 including the step of positioning a heat sink proximate said slit disk assembly, said conducting disk, and said Faraday cup assembly and circulating a fluid through said a heat sink.

15. The method of characterizing a high power electron welding beam of claim 9 including the step of positioning a heat sink proximate said slit disk assembly, said conducting disk, and said Faraday cup assembly and circulating water a fluid through said heat sink.

16. The method of characterizing a high power electron welding beam of claim 9 including the step of operating the high power electron welding beam at a power in the range of substantially 10 kW.

17. The method of characterizing a high power electron welding beam of claim 9 including the step of sweeping the beam around said slit disk assembly in a circular pattern to allow the beam to enter said radial slits and said conducting disk radial slits.

18. The method of characterizing a high power electron welding beam of claim 17 wherein said step of sweeping the beam around said slit disk assembly in a circular pattern comprises sweeping the beam around said slit disk assembly in a single circular pattern to allow the beam to enter said radial slits and said conducting disk radial slits.

19. The method of characterizing a high power electron welding beam of claim 17 wherein said step of sweeping the beam around said slit disk assembly in a circular pattern comprises sweeping the beam around said slit disk assembly in a limited number of circular patterns to allow the beam to enter said radial slits and said conducting disk radial slits.

20. The method of characterizing a high power electron welding beam of claim 17 including providing a trigger probe operatively connected to said slit disk assembly and using said trigger probe to initiate said step of sweeping the beam around said slit disk assembly in a circular pattern to allow the beam to enter said radial slits and said conducting disk radial slits.

* * * * *